(12) United States Patent
Satoh et al.

(10) Patent No.: US 7,858,955 B2
(45) Date of Patent: Dec. 28, 2010

(54) SYSTEM AND METHOD OF CONTROLLING BROAD BEAM UNIFORMITY

(75) Inventors: Shu Satoh, Byfield, MA (US); Edward C. Eisner, Lexington, MA (US); Manny Sieradzki, Manchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 241 days.

(21) Appl. No.: 12/145,713

(22) Filed: Jun. 25, 2008

(65) Prior Publication Data

US 2009/0321657 A1 Dec. 31, 2009

(51) Int. Cl.
*H01J 27/02* (2006.01)
*H01J 27/00* (2006.01)

(52) U.S. Cl. .................. 250/492.21; 250/285; 250/288; 250/396 R; 250/396 ML; 250/423 R; 250/424

(58) Field of Classification Search .................. 250/251, 250/281, 282, 285, 288, 296, 298, 299, 396 R, 250/396 ML, 397, 398, 423 R, 424, 492.1, 250/492.2, 492.21, 492.3
See application file for complete search history.

(56) References Cited

U.S. PATENT DOCUMENTS

| | | | | |
|---|---|---|---|---|
| 5,350,926 A | * | 9/1994 | White et al. | 250/492.21 |
| 5,834,786 A | * | 11/1998 | White et al. | 250/492.21 |
| 5,866,909 A | * | 2/1999 | Freeman | 250/423 R |
| 5,959,303 A | * | 9/1999 | Freeman | 250/396 ML |
| 6,323,497 B1 | * | 11/2001 | Walther | 250/492.21 |
| 6,344,750 B1 | | 2/2002 | Lo et al. | |
| RE40,008 E | * | 1/2008 | Walther | 250/492.21 |
| 7,508,487 B2 | * | 3/2009 | Mulkens et al. | 355/30 |
| 2002/0121613 A1 | * | 9/2002 | Scheuer et al. | 250/492.1 |
| 2004/0160583 A1 | * | 8/2004 | Hubertus Mulkens et al. | 355/30 |
| 2004/0212288 A1 | | 10/2004 | Kanarov et al. | |
| 2005/0269526 A1 | * | 12/2005 | Rathmell | 250/492.21 |
| 2006/0060259 A1 | * | 3/2006 | Devitt | 141/65 |
| 2008/0078949 A1 | * | 4/2008 | Benveniste | 250/492.21 |
| 2008/0149826 A1 | * | 6/2008 | Renau et al. | 250/288 |
| 2009/0272918 A1 | * | 11/2009 | Satoh | 250/492.21 |

* cited by examiner

*Primary Examiner*—Bernard E Souw
(74) *Attorney, Agent, or Firm*—Eschweiler & Associates, LLC

(57) ABSTRACT

An ion beam uniformity control system, wherein the uniformity control system comprising a differential pumping chamber that encloses an array of individually controlled gas jets, wherein the gas pressure of the individually controlled gas jets are powered by a controller to change the fraction of charge exchanged ions, and wherein the charge exchange reactions between the gas and ions change the fraction of the ions with original charge state of a broad ion beam, wherein the charge exchanged portion of the broad ion beam is removed utilizing an deflector that generates a magnetic field, a Faraday cup profiler for measuring the broad ion beam profile; and adjusting the individually controlled gas jets based upon feedback provided to the controller to obtain the desired broad ion beam.

18 Claims, 5 Drawing Sheets

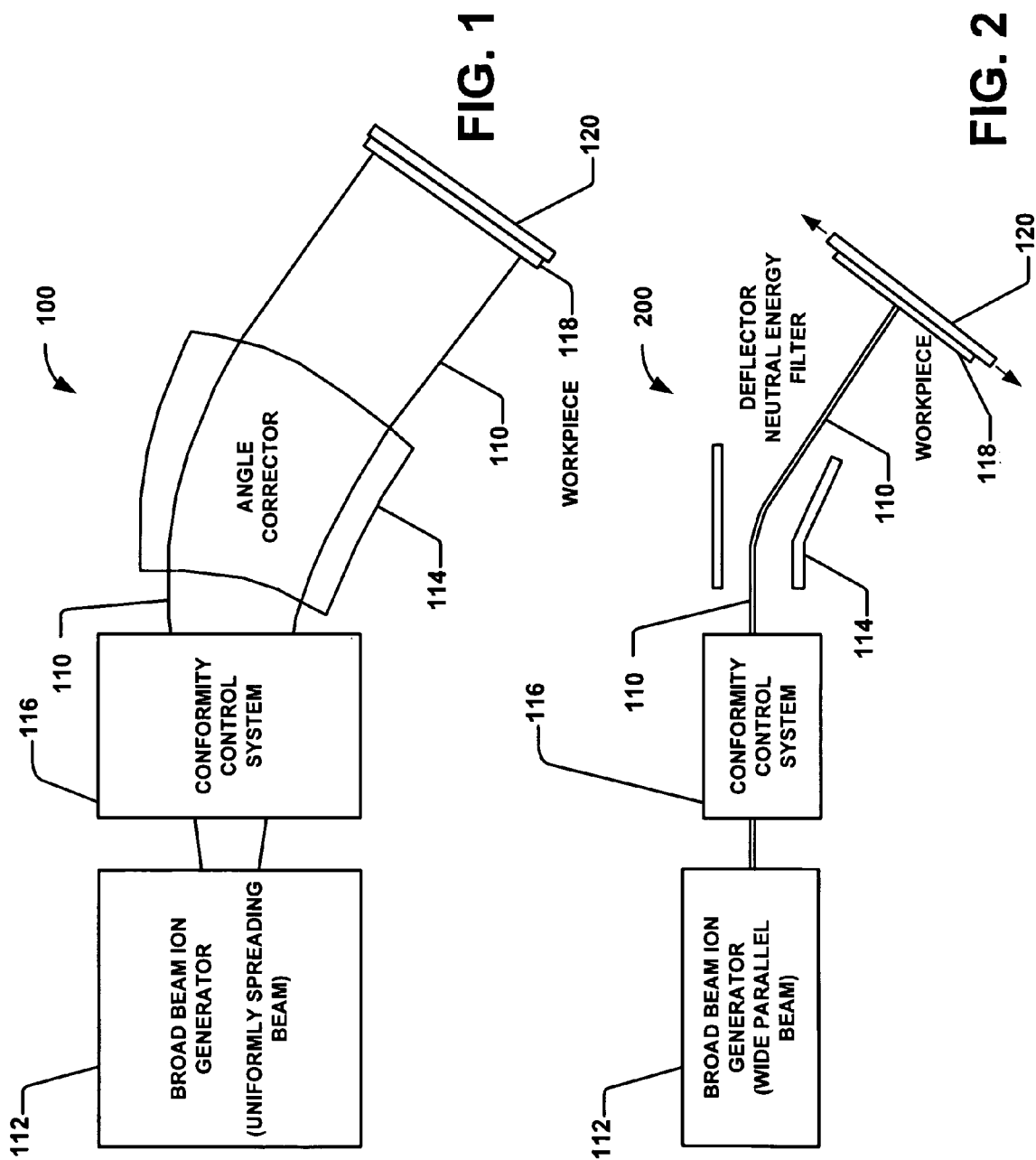

SYSTEM AND METHOD OF CONTROLLING BROAD BEAM UNIFORMITY

FIELD OF INVENTION

The present invention relates generally to ion implantation, and more particularly to systems and methods for controlling broad beam intensity uniformity.

BACKGROUND OF THE INVENTION

Ion implantation is a physical process, as opposed to diffusion, which is a chemical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source, for example. The negatively charged electrons are attracted to an oppositely charged anode, also within the chamber. During the travel from the filament to the anode, the electrons collide with the dopant source elements (e.g., molecules or atoms) and create a host of positively charged ions.

Ion implantation using a broad ion beam has several advantages over other systems and methods based on a small or smaller sized beam, for example a pencil beam. Broad ion beams have low beam current density for better ion beam transport efficiency at low energy. They also provide simplicity in terms of mechanical scanning a uniform implant beam over the entire workpiece surface, no high acceleration/deceleration in workpiece motion and a simpler architecture in ion beam optics and mechanical wafer scanning system, to name a few. There have been numerous patents granted that show various approaches to produce broad beam and techniques to correct unavoidable intensity non-uniformity across the entire width of the beam. However, most known methods to correct beam intensity non-uniformity, sacrifice ion beam angle integrity for better uniformity (intensity).

The paper, "Positive Control of Uniformity in Ribbon Beams for Implantation of Flat-Panel Displays" describes typical uniformity correction methods which trade off decreased angle integrity versus better ion beam uniformity. (See e.g., White, N. R. Positive Control of Uniformity in Ribbon Beams for Implantation of Flat-Panel Displays, Institute of Electrical and Electronics Engineers, Inc. (IEEE), 1999, pp. 354-357).

Recent applications of ion implantation demand both intensity uniformity and angle consistency over the entire workpiece/wafer surface. The industry lacks an adequate system or method to control uniformity without effecting beam angle integrity and this inability to control the uniformity independently from other parameters has forced many implanter developers to shy away from broad beam technology.

Insertion of several metal or graphite rods into the ion beam to physically block a portion of the ion beam in order to control ion beam intensity uniformity was tried previously. Those rods can be arranged in a tight row to cover the entire width of the broad ion beam and the depth each rod is inserted into the beam can be controlled remotely. However, there are several problems associated with these techniques. First, the rods made of metal can cause generation of unwanted particles and metal contamination. Secondly, the slow response of the rods moved into and out of the ion beam makes controlling the beam difficult in terms of feedback control.

Accordingly, a suitable system and method for controlling the intensity uniformity of a broad ion beam are desired, that have a fast response time and do not sacrifice ion beam angle integrity.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention according to one or more embodiments creates a ion beam uniformity control system, wherein the uniformity control system comprising a differential pumping chamber that encloses an array of individually controlled gas jets, wherein the gas pressure of the individually controlled gas jets are powered by a controller to change the fraction of charge exchanged ions, and wherein the charge exchange reactions between the gas and ions change the fraction of the ions with original charge state of a broad ion beam, wherein the charge exchanged portion of the broad ion beam is removed utilizing a deflector that generates a magnetic field, a Faraday cup profiler for measuring the broad ion beam profile; and adjusting the individually controlled gas jets based upon feedback provided to the controller to obtain the desired broad ion beam.

According to yet another embodiment of the present invention a uniformity control apparatus comprising a differential pumping chamber that encloses an array of individually controlled gas jets, wherein the gas pressure of the individually controlled gas jets are powered by a controller to change the fraction of charge exchanged ions. The charge exchanged ions neutralize a portion of a broad ion beam, wherein the neutralized portion of the broad ion beam is removed utilizing an angle corrector magnet that generates a magnetic field, a Faraday cup profiler for measuring the broad ion beam profile and adjusting the individually controlled gas jets based upon feedback provided to the controller to obtain the desired broad ion beam.

According to an embodiment of the present invention a method of fabricating an ion beam utilizing a uniformity control system comprising (a) generating and extracting ion beam, (b) analyzing the mass of the ion beam along a first path, (c) going through a uniformity control system, (d) deflecting the ion beam along a second path utilizing a magnetic field or electric field, (e) measuring the ion beam profile, (f) going to (h) if the ion beam profile is within specification, and (g) returning to (c) if the ion beam profile is not within the specification after adjusting the uniformity control system gas jets and (h) directing mass analyzed uniform-tuned ribbon beam to workpiece to be implanted.

According to another embodiment of the present an ion implantation system, comprising an ion source connected to a power source configured to generate an ion beam along a first beam path, wherein the ion beam enters a mass analysis magnet having a first dimension ($d_1$) and a second dimension ($d_2$) that is perpendicular to an xy plane, an end station containing a uniformity control system for receiving the ion beam and modifying charge contents of the ion beam utilizing an array of gas jets, wherein the gas jet pressures can be adjusted for a portion of the ion beam, an angle correction device configured to receive the ion beam and divert the beam along a second path using a magnetic force and a controller for determining the ion beam profile utilizing a Faraday cup profiler.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a cross sectional top view illustrating one type of broad ion implantation system in which a deflector/neutral filter converts a uniformly spreading ion beam from a broad ion beam generator into a final parallel broad beam in accordance with an aspect of the present invention;

FIG. 2 is a cross sectional side view illustrating yet another broad ion implantation system in which a broad ion beam generator produces a parallel, broad (shown, e.g., in and out of the paper) ion beam and an electrostatic neutral/energy filter that introduces a final bend in the ion beam before impacting the beam onto a workpiece/wafer in accordance with another aspect of the present invention;

DETAILED DESCRIPTION OF THE INVENTION

Figure 3:
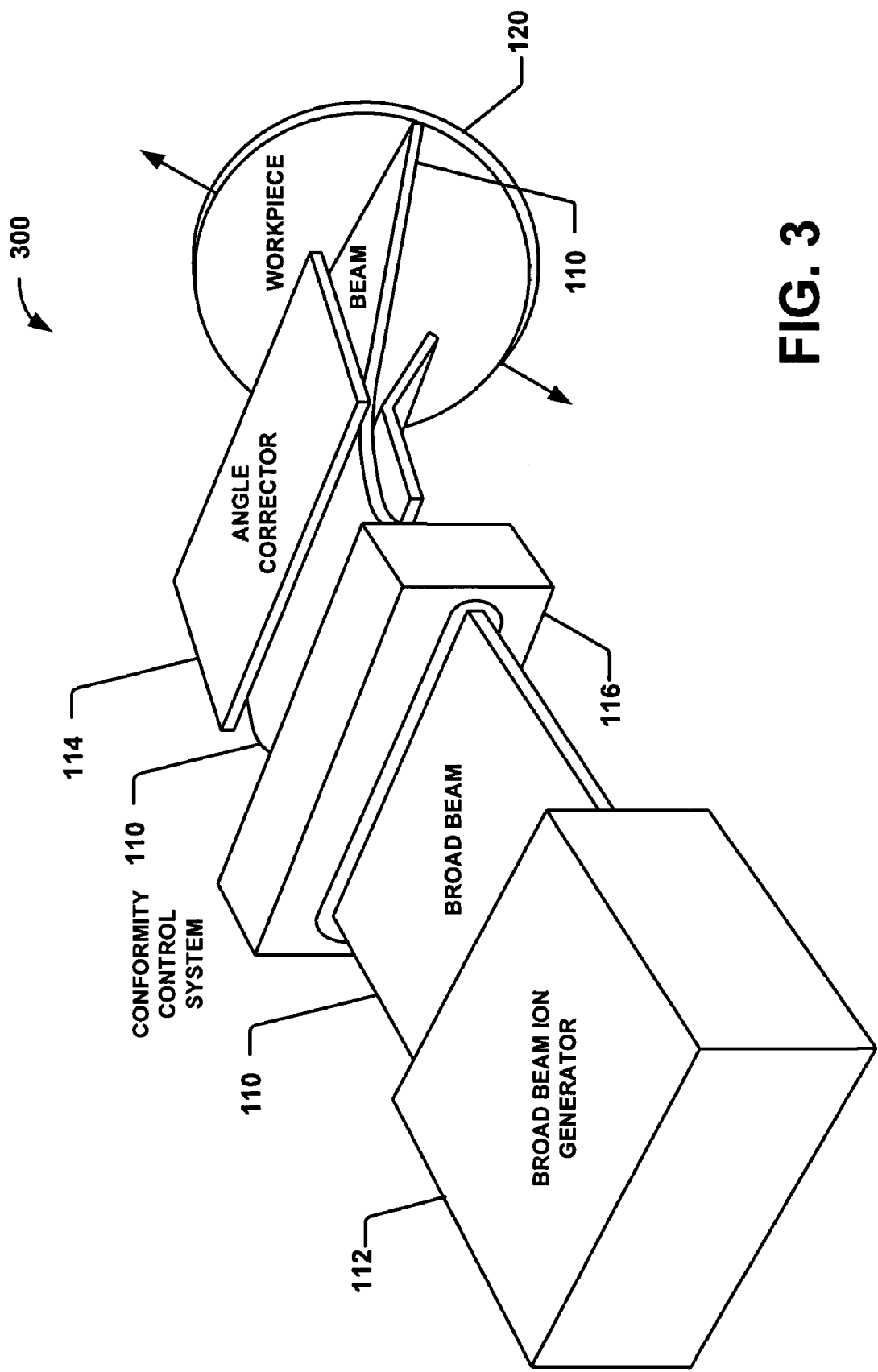
FIG. 3 is a perspective view of an ion beam control system similar to the one depicted in FIG. 2, according to another aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter. For the sake of providing a clear description of the invention, the structures and the methods will be described in connection with broad ion beam implantation. However, it is to be expressly understood that this description is not intended to be self-limiting in any manner.

Referring now to the figures, in accordance with one exemplary aspect of the present invention, FIG. 1 illustrates an exemplary broad beam, single-substrate ion implantation system 100, wherein the system 100 can be operable to scan a broad ion beam 110 in a single scan of the workpiece 118. As stated above, various aspects of the present invention may be implemented in association with any type of ion implantation system, including, but not limited to, the exemplary system 100 of FIG. 1. The exemplary ion implantation system 100 comprises a broad ion beam generator 112 which generates an uniformly spreading-out broad ion beam 110, a deflector 114, and an end station that forms a process chamber in which the ion beam 110 is directed to the workpiece 118.

The beam 110 then passes through a beam uniformity control system 116 (FIGS. 1 and 2) to make the beam 110 more uniform. The beam uniformity control system 116 will be discussed in detail below. The beam 110 can be converted to parallel beam by a deflector/neutral filter 114, then delivered to the substrate 118 on a workpiece scanning system 120 associated with the end station. Various beam forming and shaping structures (not shown) associated with the beamline assembly may be further provided, for example to maintain and bound the broad ion beam 110 when the ion beam 110 is transported along a beam path to the workpiece/substrate 118 supported on the workpiece scanning system 120.

FIGS. 2 and 3 show another exemplary broad ion implantation system, in which broad ion beam generator 112 produces a parallelized wide ion beam 110, which is then passed through a beam uniformity control system 116 and then through a deflector 114 to filter out neutral and unwanted energy components in the beam 110 before being introduced onto a workpiece 118.

An end station, for example, can be a "serial" type end station that provides an evacuated process chamber in which the single substrate 118 (e.g., a semiconductor wafer, display panel, other workpiece, etc.) is supported along the beam path for implantation with ions. It should be noted, however, that the batch or other type end stations may alternatively be employed, and fall within the scope of the present invention. In an alternative aspect of the present invention, the system 300 comprises a workpiece scanning system 120 (FIG. 1) capable of scanning in both the fast and generally orthogonal slow scan directions. In yet another aspect of the present invention, the system 300 can comprise a scheme wherein both ion beam axes are either electrically or magnetically scanned or a combination thereof. Accordingly, all such scanned or non-scanned ion beams 110 are contemplated as falling within the scope of the present invention.

Figure 4:
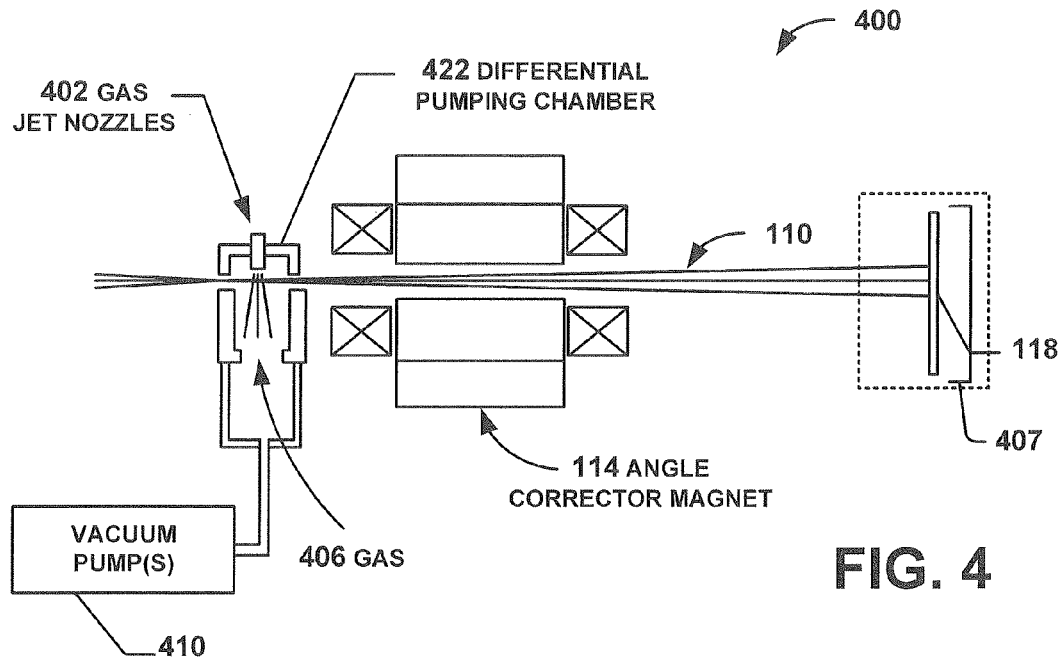
FIG. 4 is a side view illustrating an embodiment of an ion beam control system utilizing an array of collimated gas jet nozzles in accordance with an aspect of the present invention, applied to the broad beam ion implantation system illustrated in FIG. 1.

The beam uniformity control system 116 (FIG. 3) depicted in FIGS. 3, 4 and takes the same approach with respect to the beam 110 utilizing metal or graphite rods discussed supra for the localized broad ion beam attenuation by insertion of the rods into the beam 110, however with several major differences and improvements over the prior art. The inventors recognized that if the system 400 (FIG. 4) made use of an array of gas jets 506 (FIG. 5) rather than the solid rods mentioned supra, the broad ribbon beam 110 could be controlled without worry of erosion or metal contamination and with a much faster response time than the rods. The gas 406 is directed perpendicularly at the broad ion beam 110 using collimated gas jet nozzles 402. In early stage of ultra low energy (ULE) development, ion implantation developers and manufacturers realized that Xe (xenon) flow from a plasma electron flood system (PEF) was strong enough to affect an ion beam profile measured with a Faraday cup profiler 407 immediately downstream of the workpiece 118. This was because the collimated flow of Xe out of the PEF neutralizes (i.e., not in term of space charge, but charge exchange to neutral atom) the part of the beam 110 in the vicinity of the PEF (i.e., center) to elude the electrical measurement by Faraday cup profiler 407 and therefore the profiler measurement.

In this embodiment the ion beam 110 out of broad ion beam generator 112 (FIG. 3) enters the differential pumping chamber 422 which houses the array of collimated gas jet nozzles 506 (FIG. 5) made up in this embodiment of sixteen individual gas jet nozzles 518-532, for example.

After a passage of the ion beam 110 through a region of gas 406 (FIG. 4), a fraction of charge exchanged ions (i.e., typically converting +1 ions to neutrals) is given as equation 1 below;

$$F0 = 3.3E16 * P(\text{torr}) * L(\text{cm}) * \sigma(\text{cm}^2) \quad (EQ. 1)$$

wherein,

P is the pressure in torr of a gas layer of which thickness along the beam direction is L cm;

σ is a cross section for the particular charge exchange reaction; and

For a typical +1 to 0 charge exchange reaction at a medium energy (10 s of KeV) the value for a is around 4 E-16 cm$^2$.

The above formula illustrates that a gas jet, for example, 2 centimeters in diameter of approximately 4 mtorr (e.g., average value) in a high vacuum, will create neutrals (e.g., about 10%) of the ion beam 110 where the broad ion beam 110 is exposed to the array of jets 506. Since neutrals will not be bent by the deflector/neutral filter 114, the neutrals will be removed from the broad ion beam 110.

The gas jets 518-532 can be arranged in a linear fashion, for example, to impact the entire width of the broad beam 110 with a proper separation, e.g., every 2 centimeters, which can require the total sixteen gas jets 518-532, to cover the 300 mm wide broad ion beam 110. The gas jets 518-532 are connected to a mass flow controller for quick and precise control of the jet pressure. The ion beam 110 travels along a first path 240 effected by the deflector/neutral filter 114, wherein the neutral ion beam 238 travels along a second path 242. Based upon the ion beam profile obtained from the Faraday cup profiler 407, the individual gas jet nozzles 518-532 can be adjusted by adjusting the individual gas flow, to obtain the correct ion beam profile using a controller.

Figure 5:
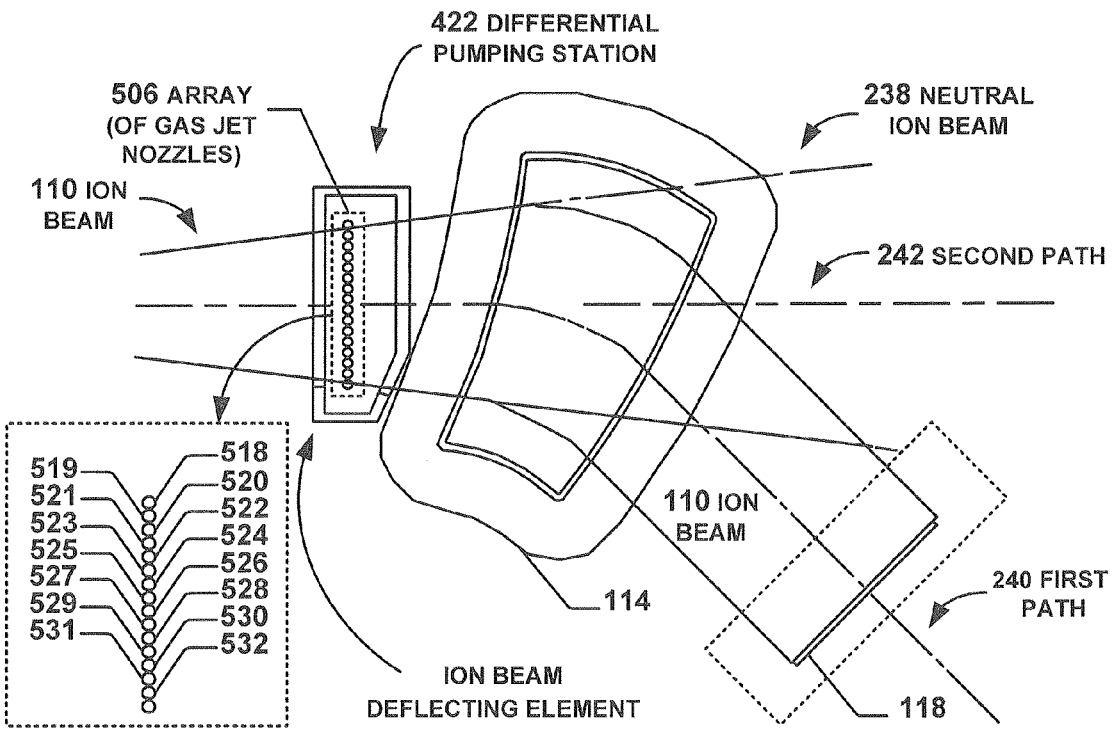
FIG. 5 is a top view illustrating the embodiment of FIG. 4, the ion beam control system utilizing a process chamber and an array of collimated gas jet nozzles in accordance with another aspect of the present invention.
Figure 6:
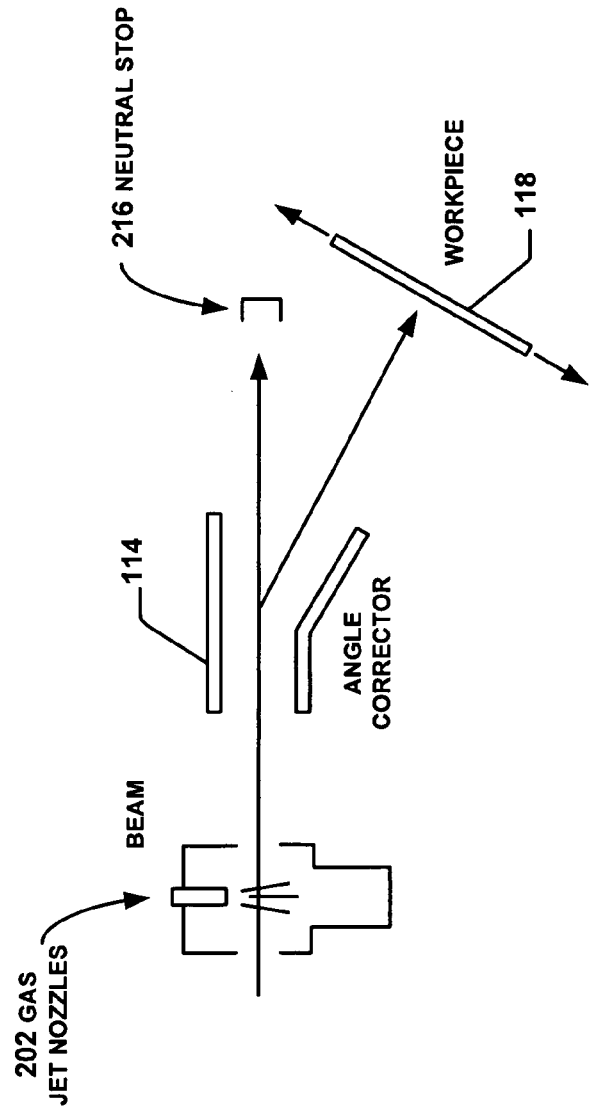
FIG. 6 is a side view illustrating an embodiment of an ion beam control system utilizing an array of collimated gas jet nozzles in accordance with an aspect of the present invention, applied to another broad beam ion implantation system similar to the one illustrated in FIG. 3.
Figure 7:
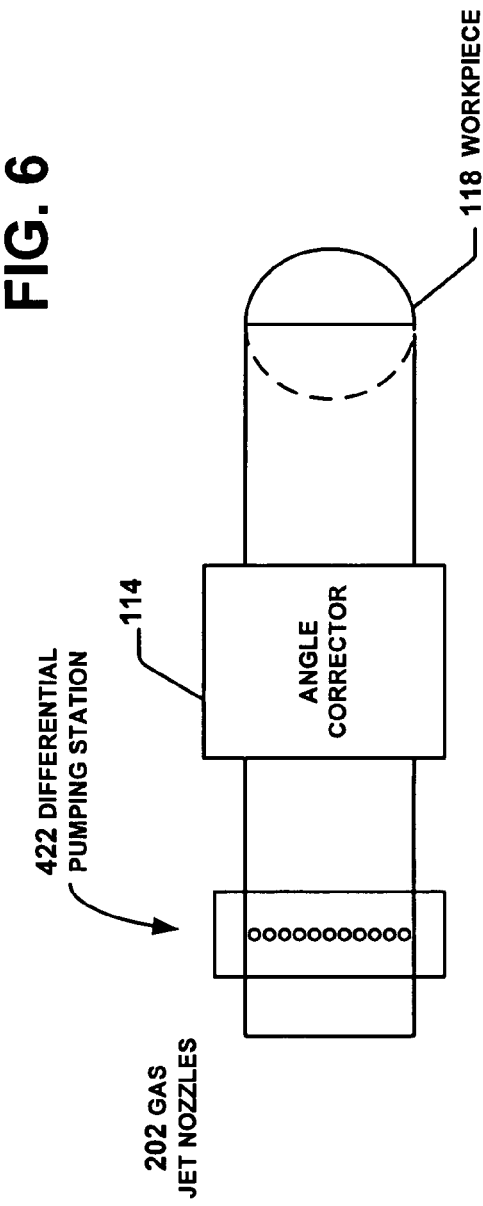
FIG. 7 is a top view illustrating the embodiment of FIG. 4, an ion beam control system utilizing a process chamber and an array of collimated gas jet nozzles in accordance with an aspect of the present invention.

FIGS. 4 and 5 show a side and top view, respectively, of another embodiment of this invention. The wide (shown as, in and out of paper) parallelized ion beam 110 is directed into a differential pumping chamber 422 which houses the array of collimated gas jet nozzles 506. The array of gas jets nozzles 506 changes neutral fractions according to local pressure distribution created by adjusting the individual flow of gas 406. When the broad ion beam 110 out of the chamber 422 is directed to neutral/energy filter 114 which bends only charged particles, any neutrals will be removed from ion beam 110 which is utilized for ion implantation to a workpiece 118.

The gas 406 may be any gas which exhibits high charge exchange cross section to the ion beam 110. The pumping characteristic of the gas 406 is another good guideline to use in choosing the gas. For example, gas 406 of high molecular mass, for example, Xe, has less conductance to area of beam line and therefore will not worsen high vacuum in nearby beam line area. Pumping speed by a type of vacuum pump 410, most likely a cryopump, can be another guideline in the gas selection. The cryopump can exhibit large pumping speed to any condensable gases, like, Xe, $CO_2$, water vapor, $N_2$ and the like.

Figure 8:
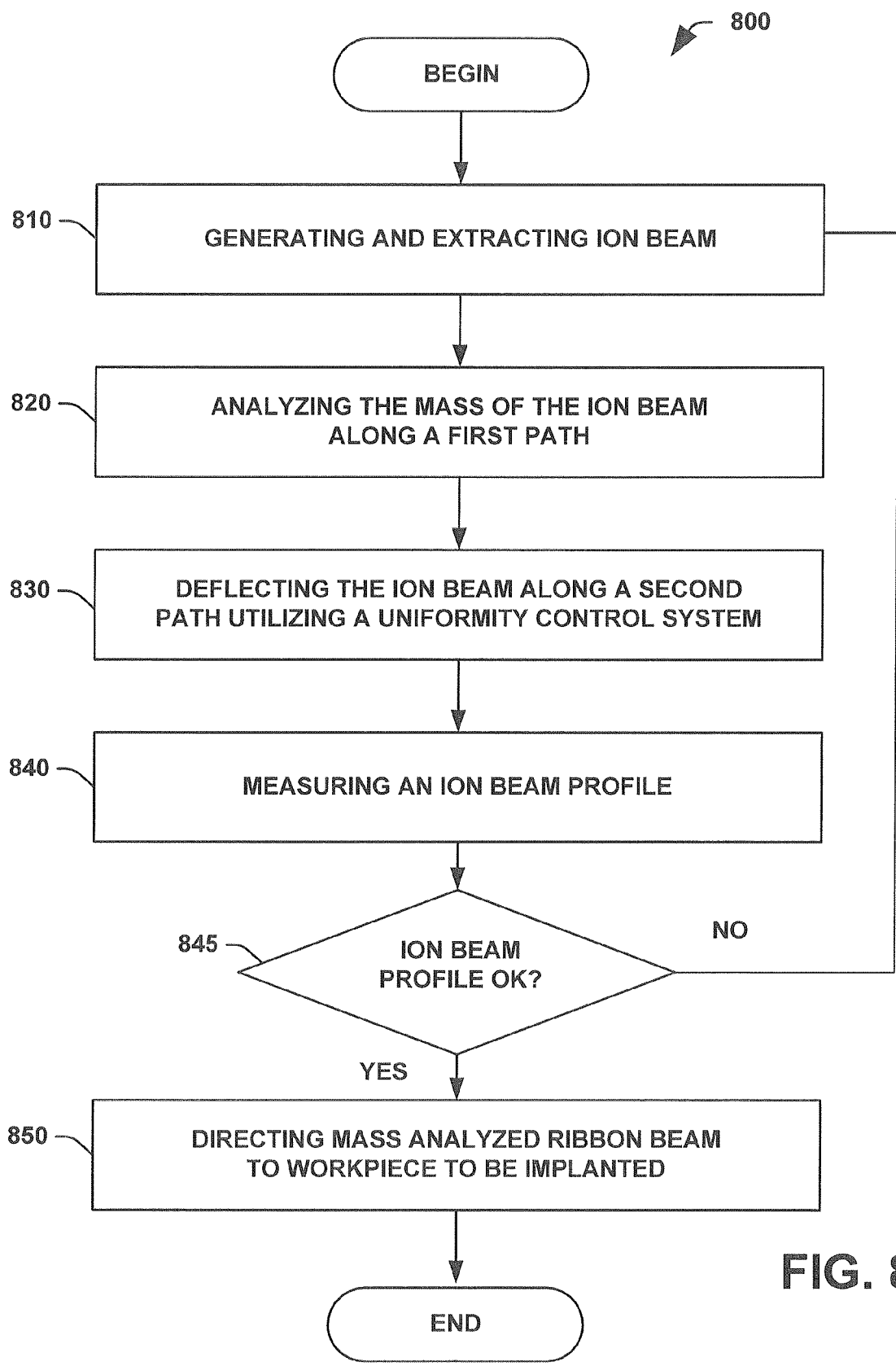
FIG. 8 is a functional block diagram illustrating a method of ion beam control according to yet another embodiment of the present invention.

FIG. 8 illustrates an exemplary method 800 according to at least one aspect of the present invention. The method will be described with respect to other figures mentioned supra for illustration purposes. The method 800 of FIG. 8 begins at 810 wherein an ion beam 110 (FIG. 1) is generated and extracted utilizing a broad beam ion generator 112 (FIG. 1).

At 820 the mass of the ion beam is analyzed along a first path wherein the broad ion beam 110 passes through a uniformity control system 116 at 820. As discussed supra the beam uniformity control system 116 (FIG. 3) depicted in FIGS. 3, 4 and 5 takes the same approach with respect to the beam 110 as utilizing metal or graphite rods discussed supra for the localized broad ion beam attenuation by insertion of the rods into the beam 110, however with several major differences and improvements over the prior art. The inventors recognized that if the system 400 (FIG. 4) made use of an array of gas jets 506 (FIG. 5) rather than the solid rods mentioned supra, the broad ribbon beam 110 could be controlled without worry of erosion or metal contamination and with a much faster response time than the rods. The gas 406 is directed perpendicularly at the broad ion beam 110 using collimated gas jet nozzles 402. At 830, the neutral/energy filter 114 deflects the ion beam along a second path by bending only charged particles, thereby removing any neutrals from ion beam 110 and utilizing the beam of charged particles for ion implantation into a workpiece 118.

At 840 an ion beam profile is measured and at 845 it is determined if the ion beam profile is within specification. If the beam profile is within specification ('YES' at 845), the method proceeds to 850 wherein the system directs the mass analyzed ribbon beam 110 to the workpiece to be implanted. If the ion beam profile is not within specification the method returns to 810 until the beam 110 is within specification.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, apparatus, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion beam uniformity control system, comprising:
   a differential pumping chamber that encloses an array of individually controlled gas jets;
   wherein gas pressures of the individually controlled gas jets are powered by a controller to change a fraction of charge exchanged ions;
   wherein charge exchange reactions between the gas jets and ions change a fraction of ions with an original charge state of a broad ion beam;
   wherein a charge exchanged portion of the broad ion beam is removed by utilizing a deflector that generates a magnetic field; and
   a Faraday cup profiler to measure a profile of the broad ion beam and to facilitate adjustment of the individually controlled gas jets based upon feedback provided to the controller to obtain a desired broad ion beam profile differing from the measured profile of the broad ion beam.

2. The system of claim 1, wherein the magnetic field is created with a device comprising a deflector and an electronic device.

3. The system of claim 1, wherein the gas comprises at least one of the following; water vapor, $CO_2$ and Xe.

4. The system of claim 1, wherein the system utilizes a gas that has a high charge exchange cross section.

5. The system of claim 1, wherein the controller adjusts the gas pressure of the individually controlled gas jets.

6. The apparatus of claim 1, wherein the individually controlled gas jets include supersonic gas jets.

7. The system of claim 1, wherein the array of gas jets is positioned wherein an ion beam thickness is approximately a minimum thickness.

8. The system of claim 1, wherein the individual controlled gas jets can be individually tilted or the array of jets can be tilted into the upstream ion beam.

9. The system of claim 1, wherein the array of jets can be tilted into the downstream ion beam.

10. The system of claim 1, wherein the broad ion beam comprises a ribbon beam and a broad ribbon beam.

11. An ion implantation system, comprising:
    an ion source connected to a power source configured to generate an ion beam along a first beam path;
    wherein the ion beam enters a deflector having a first dimension ($d_1$) and a second dimension ($d_2$) that is perpendicular to an xy plane;
    an end station containing a uniformity control system for receiving the ion beam and changing the portion of original charge state with the ion beam utilizing an array of gas jets;
    wherein the individual gas jet pressures can be adjusted for a portion of the ion beam;
    a magnetic or electrostatic device configured to receive the ion beam and divert the beam along a second path using a magnetic or electrostatic force; and
    a controller for determining the ion beam profile utilizing a Faraday cup profiler.

12. The system of claim 1, wherein the ion beam comprises a ribbon beam and a broad ribbon beam.

13. The system of claim 1, wherein the magnetic field is created with a device comprising a deflector and an electronic device.

14. The system of claim 1, wherein the gas comprises at least one of the following: water vapor, $CO_2$ and Xe.

15. An ion implantation system, comprising:
    an ion beam source to provide an ion beam along a beam path;
    an array of individually controlled gas jets to provide respective streams of gas having respective pressures, wherein the streams of gas impinge upon the beam path;
    a beam profiler to measure an ion beam profile of the ion beam downstream of the array of individually controlled gas jets; and
    a controller to selectively adjust a gas pressure provided by one or more of the individually controlled gas jets based on the measured ion beam profile.

16. The ion implantation system of claim 15, wherein a stream of gas comprises at least one of the following: water vapor, $CO_2$, Xe, or $N_2$.

17. The ion implantation system of claim 15, further comprising:
    a magnetic or electrostatic device downstream of the array of individually controlled gas jets and configured to divert the ion beam using a magnetic or electrostatic force.

18. The ion implantation system of claim 15, wherein angles at which the gas jets impinge the beam path are selectively adjusted based upon the measured ion beam profile.

* * * * *